United States Patent
Tsai et al.

(10) Patent No.: US 6,940,329 B2
(45) Date of Patent: Sep. 6, 2005

(54) HYSTERESIS CIRCUIT USED IN COMPARATOR

(75) Inventors: Chung-Pei Tsai, Sanchong (TW); Yi-Min Wu, Taoyuan (TW)

(73) Assignee: Prolific Technology Inc., Taipei (TW)

( * ) Notice: Subject to any disclaimer, the term of this patent is extended or adjusted under 35 U.S.C. 154(b) by 0 days.

(21) Appl. No.: 10/821,892

(22) Filed: Apr. 12, 2004

(65) Prior Publication Data
US 2005/0046447 A1 Mar. 3, 2005

(30) Foreign Application Priority Data
Sep. 2, 2003 (TW) ........................ 92124240 A (51) Int. Cl.$^7$ ..................... H03K 3/037; H03K 3/12
(52) U.S. Cl. ........................ 327/205; 327/65
(58) Field of Search ............... 327/50, 63, 65, 327/67, 205, 206, 560, 563; 330/253, 258

(56) References Cited

U.S. PATENT DOCUMENTS

| | | | | |
|---|---|---|---|---|
| 5,313,114 A | * | 5/1994 | Poletto et al. | ................. 327/65 |
| 2004/0160245 A1 | * | 8/2004 | Brooks et al. | ................. 327/65 |

FOREIGN PATENT DOCUMENTS

TW        508567        11/2002

OTHER PUBLICATIONS

English Language Abstract, Brief Description of Drawings and Independent Claims 1 and 10 of Taiwanese Pat. Pub. No. 508567.

* cited by examiner

Primary Examiner—Long Nguyen
(74) Attorney, Agent, or Firm—Michael Bednarek; Pillsbury Winthrop Shaw Pittman LLP (57) ABSTRACT

A hysteresis circuit for use in a comparator having a first and a second transistors as an input stage and a constant current source. The hysteresis circuit comprises a first resistor disposed between a source of the first transistor and the constant current source and a second resistor disposed between a source of the second transistor and the constant current source, and comprises a first and a second current generating means. The first current generating means supplies a current to the source of the first transistor and derives a current out from the source of the second transistor if an output signal of the comparator is a first logic value, while the second current generating means supplies a current to the source of the second transistor and derives a current out from the source of the first transistor if the output signal of the comparator is a second logic value.

14 Claims, 7 Drawing Sheets

HYSTERESIS CIRCUIT USED IN COMPARATOR

BACKGROUND OF THE INVENTION

1. Field of the Invention

The present invention relates to an electronic circuit, and particularly, to a circuit for providing hysteresis in a differential input comparator.

2. Description of the Related Art

A typical comparator is provided with two input terminals for comparing an input voltage signal and a reference voltage signal respectively received at the two input terminals, amplifying the voltage difference between the two signals and then producing an output signal with a logic high voltage or a logic low voltage based on the voltage difference. Generally, a logic high signal is produced at the output of the comparator when the input voltage is higher than the reference voltage. On the other hand, a logic low signal is produced at the output of the comparator when the input voltage is lower than the reference voltage.

Figure 1:
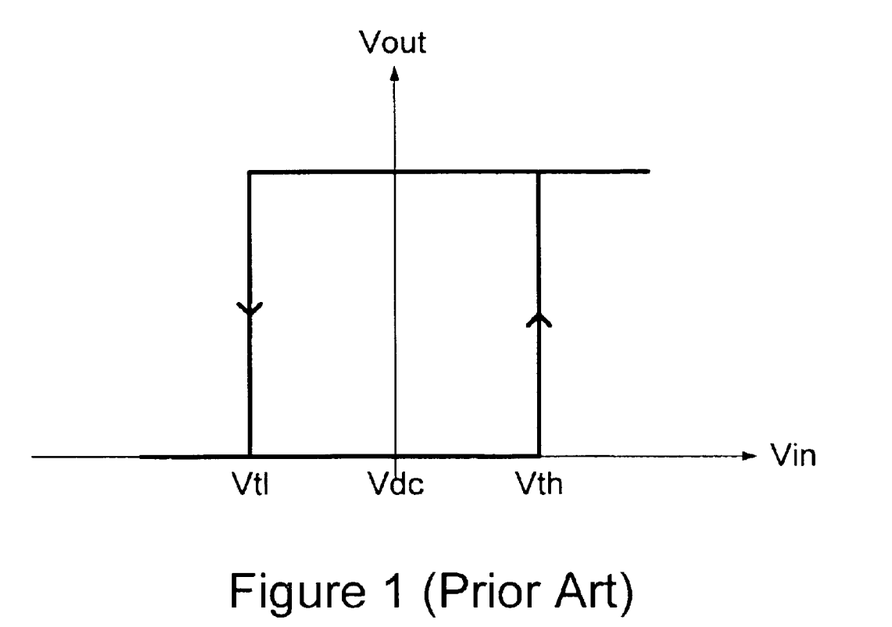
FIG. 1 is a graph showing the changes in an output voltage of a comparator with a hysteresis characteristic.

In order to prevent erroneous changes in the output voltage of the comparator resulting from noises in the input voltage signal or in the reference voltage signal, a typical solution to provide a hysteresis circuit in the comparator, so that a threshold voltage at which the output voltage of the comparator changes from logic low to logic high is different from a threshold voltage at which the output voltage of the comparator changes from logic high to logic low. FIG. 1 is a graph showing the relation between the input voltage signal and the output voltage signal of a comparator with a hysteresis characteristic, in which the horizontal axis represents the input voltage signal Vin while the vertical axis represents the output voltage signal Vout. When the output voltage signal Vout is in a logic low state, the input voltage signal Vin must rise above an upper threshold voltage Vth so that the output voltage signal Vout will change from logic low to logic high. When the output voltage signal Vout is in a logic high state, the input voltage signal Vin must fall below a lower threshold voltage Vtl so that the output voltage signal Vout will change from logic high to logic low. The voltage difference between the upper threshold voltage Vth and the lower threshold voltage Vtl is referred to as a hysteresis width, which is usually designed to be several hundreds of Millivolts.

Figure 2:
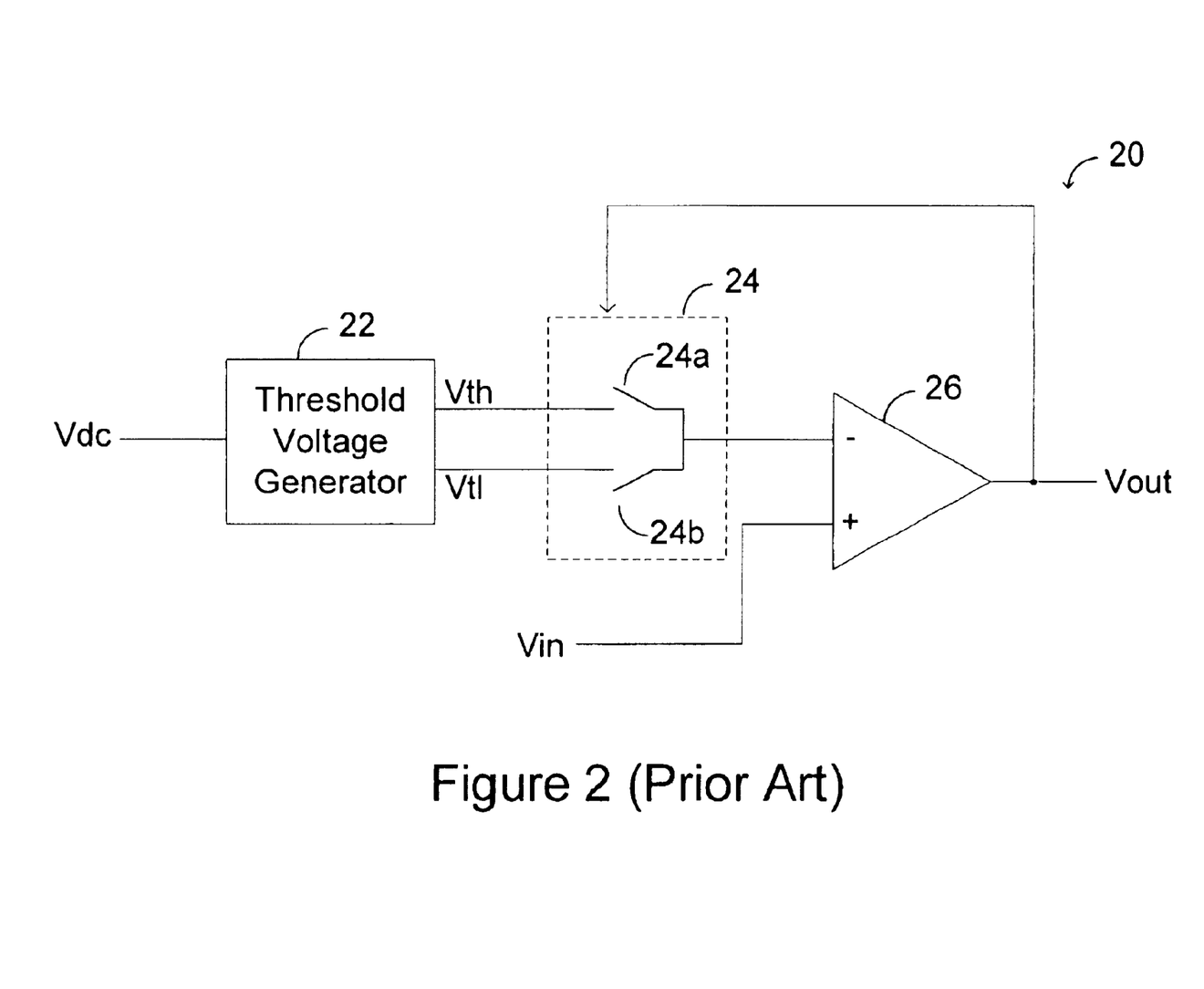
FIG. 2 depicts a schematic circuit diagram of a conventional hysteresis comparing device.

R.O.C. Patent Publication No. 508567, titled "Hysteresis comparing device with constant hysteresis width" discloses a comparator circuit having a hysteresis characteristic. FIG. 2 illustrates a schematic circuit diagram of the hysteresis comparing device disclosed in the above patent. As shown in FIG. 2, the hysteresis comparing device 20 comprises a threshold voltage generator 22, a selection switching device 24 and a comparator 26. The hysteresis comparing device 20 receives an input voltage signal Vin and produces an output voltage signal Vout. The threshold voltage generator 22 generates an upper threshold voltage Vth and a lower threshold voltage Vtl from a DC voltage signal Vdc according to a desired hysteresis width. The selection switching device 24 includes a first switch 24a and a second switch 24b, which are controlled on the basis of the output voltage signal Vout of the comparator 26 to select one of the upper threshold voltage Vth and the lower threshold voltage Vtl as a reference voltage signal of the comparator. When the output voltage signal Vout is in a logic low state, the switch 24a is turned ON while the switch 24b is turned OFF, and thus the upper threshold voltage Vth is output from the selection switching device 24. On the other hand, when the output voltage signal Vout is in a logic high state, the switch 24a is turned OFF while the switch 24b is turned ON, and thus the lower threshold voltage Vtl is output from the selection switching device 24. According to the above design, when the output voltage signal Vout is in a logic low state, the input voltage signal Vin must rise above the upper threshold voltage Vth so that the output voltage signal Vout will change from logic low to logic high; when the output voltage signal Vout is in a logic high state, the input voltage signal Vin must fall below the lower threshold voltage Vtl so that the output voltage signal Vout will change from logic high to logic low. Thereby, the hysteresis effect is achieved.

However, the prior art circuit in FIG. 2 is designed by providing an external threshold voltage generating circuit to a comparator to thereby obtain a hysteresis effect, which is disadvantageous because of its slow switching rate and the complicated circuit components. Such a comparing device is impossible to be designed into an integrated circuit. Therefore, it is desired to develop comparator hysteresis circuit, which is fast in switching rate, simple in circuit structure and suitable for application in an integrated circuit.

SUMMARY OF THE INVENTION

The object of the present invention is to provide a hysteresis circuit for a comparator, which is disposed in the comparator circuit and has the advantages of fast switching rate, simple structure and fewer components.

Another object of the present invention is to provide a hysteresis circuit for a comparator, which is configured only by current source elements and resistor elements and thus is suitable for use in an integrated circuit to provide a hysteresis width insensible to variations of the power supply voltage and the temperature.

The hysteresis circuit according to the present invention may be employed in a differential comparator having a differential input stage including a first transistor and a second transistor. Each of the first transistor and the second transistor has a gate terminal serving as one of two input terminals of the comparator. The comparator further includes a constant current source for supplying a constant current to the differential input stage of the comparator. The hysteresis circuit of the present invention comprises a first and a second resistor elements, a first to a fourth constant current source elements and a first to a fourth switch elements, all disposed in the above comparator. Both the first and the second resistor elements have the same resistance value. The first resistor element is coupled between a source terminal of the first transistor and the constant current source element of the comparator, while the second resistor element is coupled between a source terminal of the second transistor and the constant current source element of the comparator. Each of the first to the fourth constant current source elements produces a constant current, which is of the same value as the current produced by the constant current source of the comparator. The first switch element is coupled between the first constant current source element and the source terminal of the first transistor so that the first constant current source element selectively supplies a constant current to the source terminal of the first transistor. The second switch element is coupled between the second constant current source element and the source terminal of the first transistor so that the second constant current source element selectively derives a constant current out from the source terminal of the first transistor. Symmetrically, the third switch element is coupled between the third constant current source element and the source terminal of the second transistor so that the third constant current source element selectively supplies a constant current to the source terminal of the second transistor. Similarly, the fourth switch element is coupled between the fourth constant current source element and the source terminal of the second transistor so that the fourth constant current source element selectively derives a constant current out from the source terminal of the second transistor. ON/OFF operations of the first to the fourth switch elements are controlled based on a signal from the output terminal of the comparator. If the signal from the output terminal of the comparator is a first logic value, then the first and the fourth switch elements are turned ON while the second and the third switch elements are turned OFF. If the signal from the output terminal of the comparator is a second logic value, then the first and the fourth switch elements are turned OFF while the second and the third switch element are turned ON.

With the above configuration according to the present invention, a single-side hysteresis width equal to the current value I of the constant current source element multiplied by twice the resistance value R of the resistor element, i.e., a double-side hysteresis width equal to twice the single-side hysteresis width, can be provided.

BRIEF DESCRIPTION OF THE DRAWINGS

Objects and advantages of the present invention will be fully understood from the detailed description to follow taken in conjunction with the embodiments as illustrated in the accompanying drawings, wherein.

DETAILED DESCRIPTION OF THE PREFERRED EMBODIMENT

Figure 4:
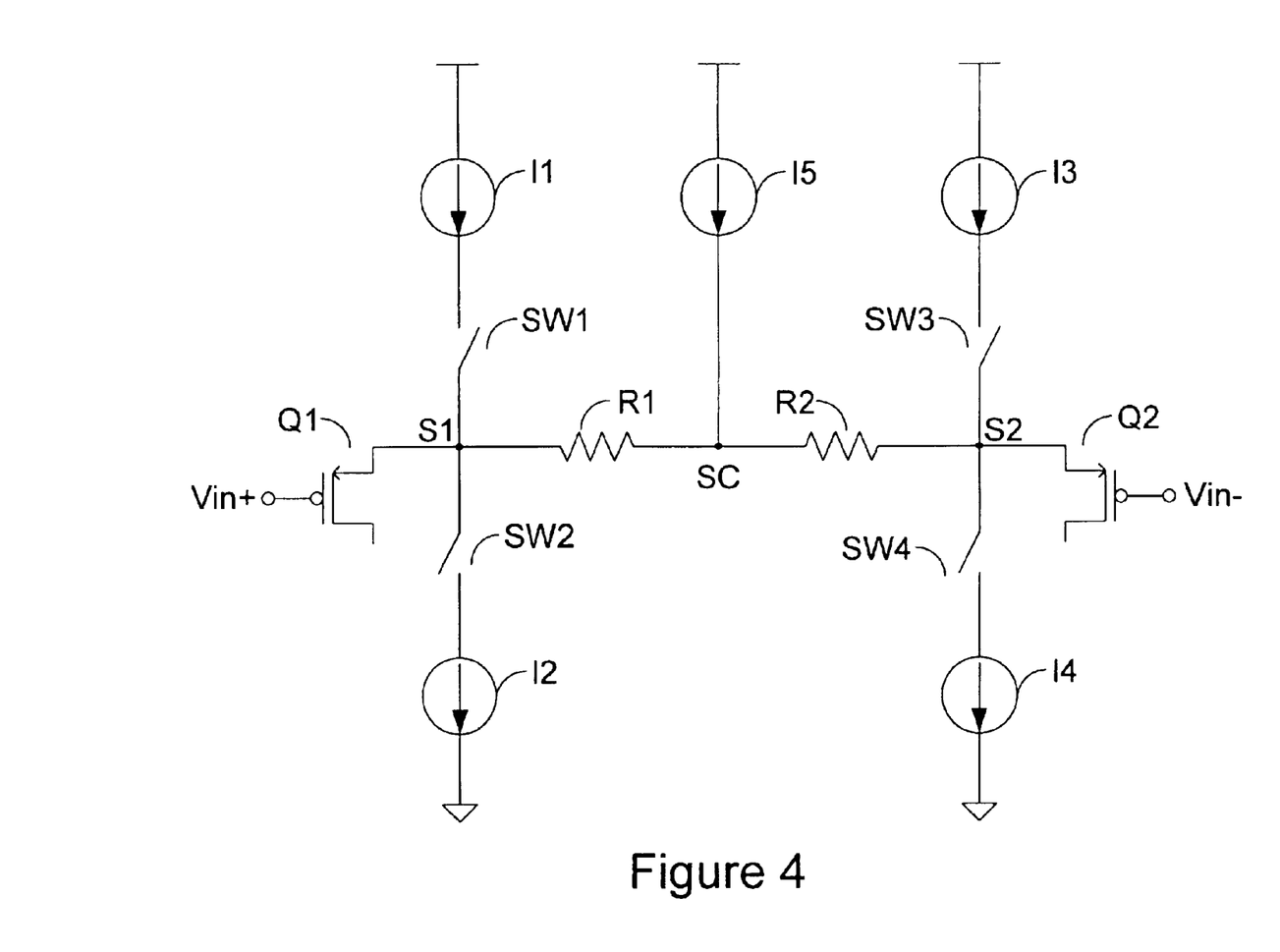
FIG. 4 depicts a schematic circuit diagram of a comparator employing the hysteresis circuit according to the present invention.

Referring to FIG. 4, a circuit diagram of a comparator employing the hysteresis circuit according to the present invention is shown. It should be noted that, for simplicity, only components associated with the hysteresis circuit, instead of complete circuit components, are illustrated in the circuit diagram in FIG. 4. As shown, a differential input comparator is provided with an input stage, including a first PMOS transistor Q1 and a second PMOS transistor Q2. The first PMOS transistor Q1 and the second PMOS transistor Q2 are two PMOS transistors with substantially the same characteristics, and the gate terminals thereof are respectively used as two input terminals of the comparator to respectively receive a first input signal Vin+ and a second input signal Vin−. The comparator further comprises a constant current source (the fifth constant current source) I5 for producing a constant current of "I", which is supplied to the input stage of the comparator. Moreover, the comparator has an output terminal (not shown) for outputting an output signal Vout, which is generated based on a voltage difference ΔV between the first input signal Vin+ and the second input signal Vin−.

According to the hysteresis circuit for a comparator of the present invention, a first resistor R1, a second resistor R2, a first constant current source I1, a second constant current source I2, a third constant current source I3, a fourth constant current source I4, a first switch SW1, a second switch SW2, a third switch SW3 and a fourth switch SW4 are provided in the differential input comparator. The first resistor R1 and the second resistor R2 are series coupled between a source terminal S1 of the first PMOS transistor Q1 and a source terminal S2 of the second PMOS transistor Q2. More specifically, two ends of the first resistor R1 are respectively connected to the source terminal S1 of the first PMOS transistor Q1 and to the fifth constant current source I5, and two ends of the second resistor R2 are respectively connected to the source terminal S2 of the second PMOS transistor Q2 and to the fifth constant current source I5. Both the first resistor R1 and the second resistor R2 have substantially the same resistance value "R". Each of the first to the fourth constant current sources I1~I4 produces a constant current having substantially the same current value I as the current produced by the fifth constant current source I5. The first constant current source I1 is coupled to the source terminal S1 of the first PMOS transistor Q1 via the first switch SW1 to thereby selectively supply a constant current to the source terminal S1 of the first PMOS transistor Q1 through the operation of the first switch SW1. The second constant current source I2 is coupled to the source terminal S1 of the first PMOS transistor Q1 via the second switch SW2 to thereby derive a constant current out from the source terminal S1 of the first PMOS transistor Q1 through the operation of the second switch SW2. Similarly, the third constant current source I3 is coupled to the source terminal. S2 of the second PMOS transistor Q2 via the third switch SW3 to thereby supply a constant current to the source terminal S2 of the second PMOS transistor Q2 through the operation of the third switch SW3. The fourth constant current source I4 is coupled to the source terminal S2 of the second PMOS transistor Q2 via the fourth switch SW4 to thereby derive a constant current out from the source terminal S2 of the second PMOS transistor Q2 through the operation of the fourth switch SW4. In addition, the hysteresis circuit for a comparator according to the present invention further comprises a switch element control means (not shown) for controlling the ON/OFF operations of the first to the fourth switches SW1~SW4. The switch element control means controls the first to the fourth switches SW1~SW4 based on the output signal Vout from the output terminal (not shown) of the comparator. If the output signal Vout from the output terminal of the comparator is in a logic low state, the first and the fourth switches are turned ON, while the second and the third switches are turned OFF. Consequently, the first constant current source I1 supplies a constant current to the source terminal S1 of the first PMOS transistor Q1, and the fourth constant current source I4 derives a constant current out from the source terminal S2 of the second PMOS transistor. If the output signal Vout from the output terminal of the comparator is in a logic high state, the first and the fourth switches are turned OFF, while the second and the third switches are turned ON. Consequently, the third constant current source I3 supplies a constant current to the source terminal S2 of the second PMOS transistor Q2, and the second constant current source I2 derives a constant current out from the source terminal S1 of the first PMOS transistor Q1.

Figure 3:
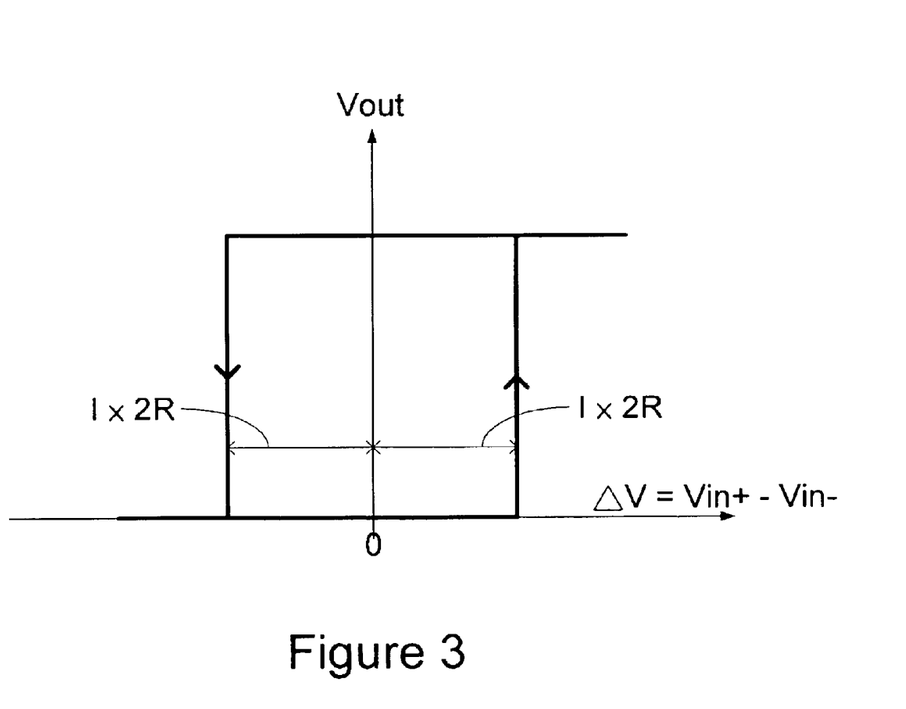
FIG. 3 is a graph showing the changes in output voltage of a comparator employing the hysteresis circuit according to the present invention.

The comparator employing the hysteresis circuit according to the present invention has a hysteresis characteristic as shown in FIG. 3. Specifically, when the output signal Vout from the output terminal of the comparator is in a logic low state, the output signal Vout will change from logic low to logic high only if the first input signal Vin+ is higher than the second input signal Vin− plus a voltage difference of "I×2R". When the output signal Vout from the output terminal of the comparator is in a logic high state, the output signal Vout will change from logic high to logic low only if the first input signal Vin+ is lower than the second input signal Vin− minus a voltage difference of "I×2R". Depending on practical demands of the circuit design, the resistance value "R" and the current value "I" may be properly selected to obtain a desired fixed/adjustable hysteresis width, which is insensible to variations of the power supply voltage and the temperature.

Next, the operation of the circuit according to the present invention will be described with reference to FIGS. 5(a), 5(b), 6(a) and 6(b).

Figure 5A:
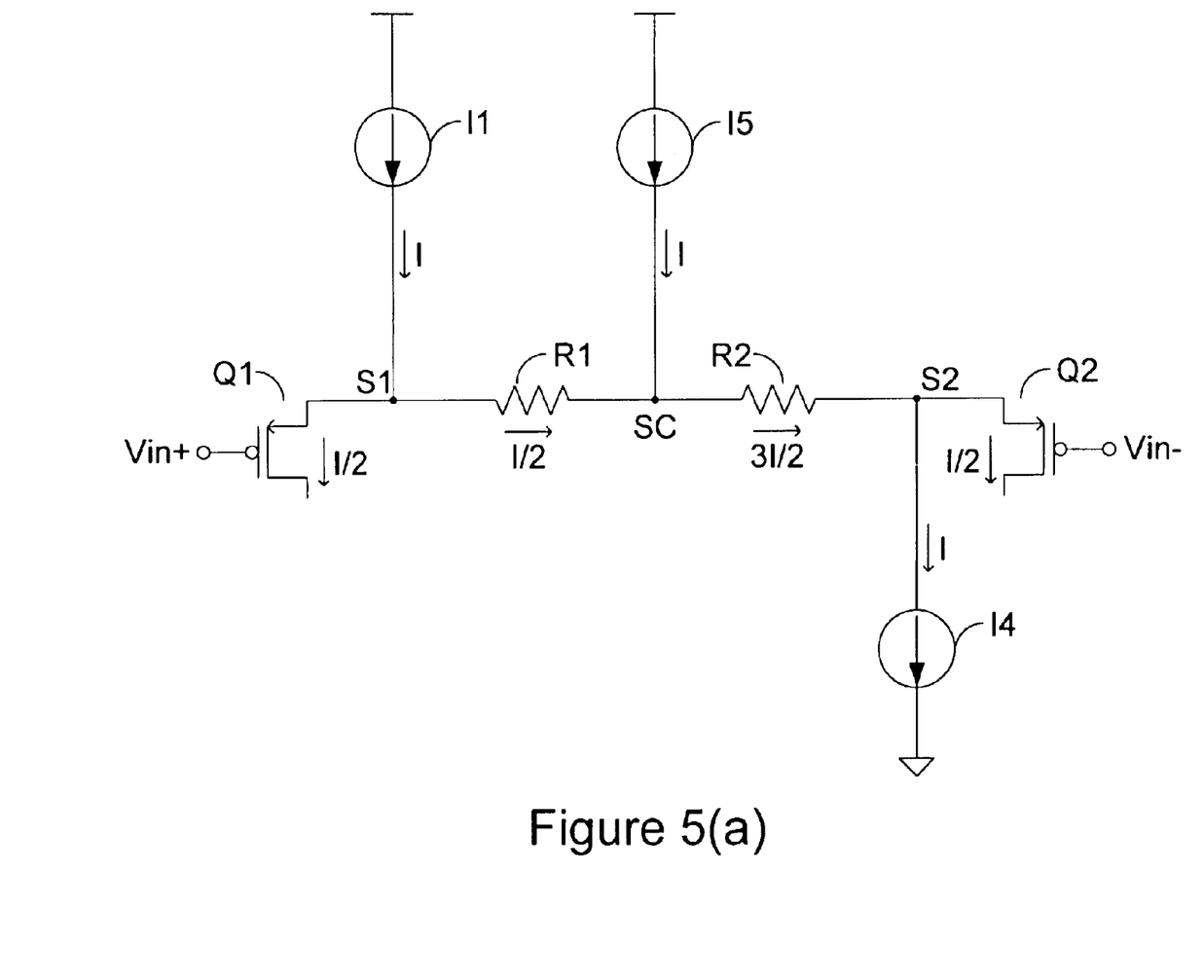
FIGS. 5(a) and 5(b) are circuit diagrams explaining the operations of the comparator as the output signal changes from logic low to logic high.
Figure 5B:
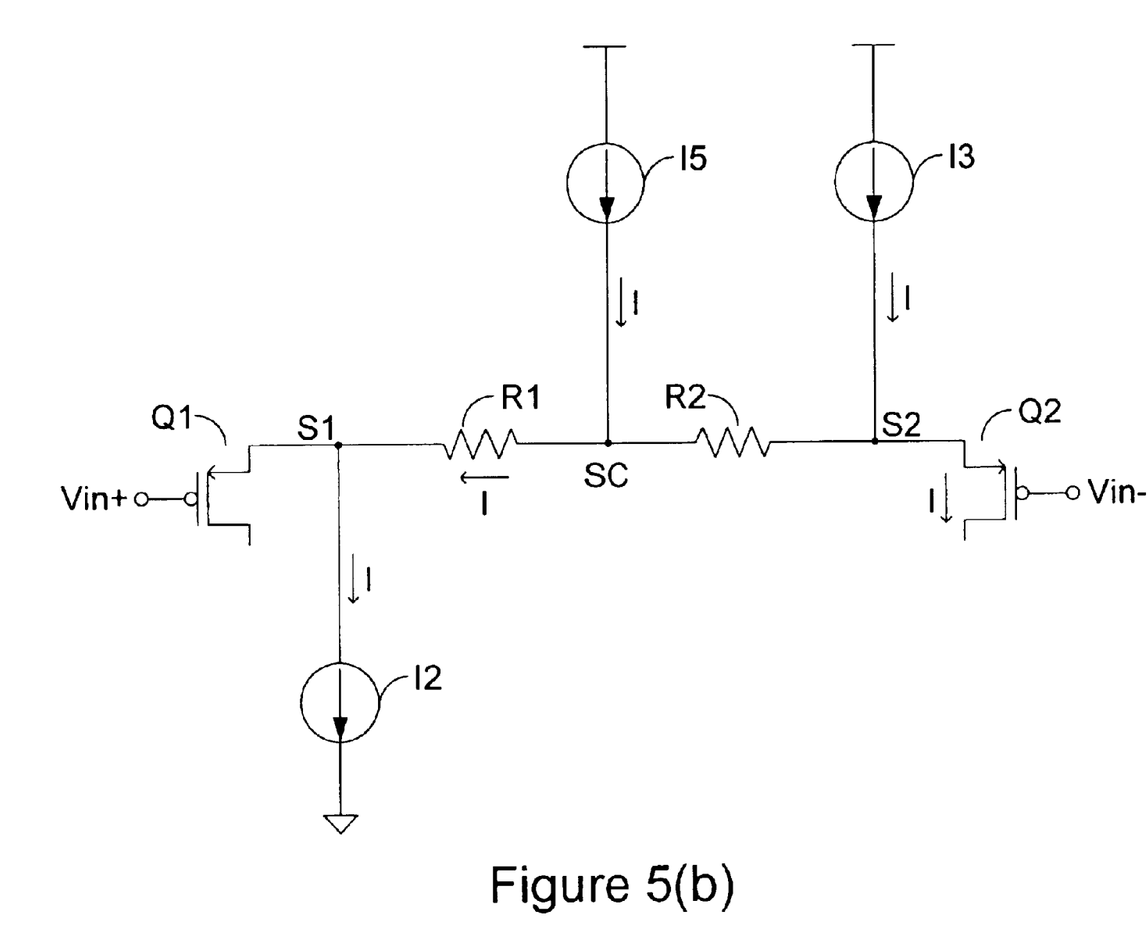

FIGS. 5(a) and 5(b) are circuit diagrams explaining the operations of the comparator as the output signal changes from logic low to logic high. When the output signal Vout from the output terminal of the comparator is in a logic low state, the first and the fourth switches are ON and the second and the third switches are OFF, and therefore the first constant current source I1 supplies a constant current I to the source terminal S1 of the first PMOS transistor Q1 while the fourth constant current source I4 derives a constant current I out from the source terminal S2 of the second PMOS transistor Q2. At this time, if the first input signal Vin+ at the input terminal of the comparator gradually increases so that the first input signal Vin+ exceeds the second input signal Vin−, the second PMOS transistor Q2 will be turned on but the first PMOS transistor Q1 has not yet been turned off. Therefore, as shown in FIG. 5 (a), each the first PMOS transistor Q1 and the second PMOS transistor Q2 conducts a current of "I/2", and thus the current flowing through the first resistor R1 and the current flowing through the second resistor R2 are "I/2" and "3I/2", respectively. Accordingly, a voltage difference between the source terminal S1 of the first PMOS transistor Q1 and the source terminal S2 of the second PMOS transistor Q2 is (I/2)×R+(3I/2)×R=I×2R. For this reason, when the first input signal Vin+ exceeds the second input signal Vin−, the output signal Vout will not immediately change from logic low to logic high. Instead, the output signal Vout changes from logic low to logic high only when the voltage difference ΔV between the first input signal Vin+ and the second input signal Vin− is greater than I×2R.

As shown in FIG. 5 (b), after the output signal Vout changes from logic low to logic high, the first and the fourth switches are OFF and the second and the third switches are ON. In this case, the first and the fourth constant current sources I1 and I4 are considered no longer present, and therefore the third constant current source I3 supplies a constant current I to the source terminal S2 of the second PMOS transistor Q2 while the second constant current source I2 derives a constant current I out from the source terminal S1 of the first PMOS transistor Q1. At this time, the first PMOS transistor Q1 is turned OFF, and the second PMOS transistor Q2 conducts a current of "I".

Figure 6A:
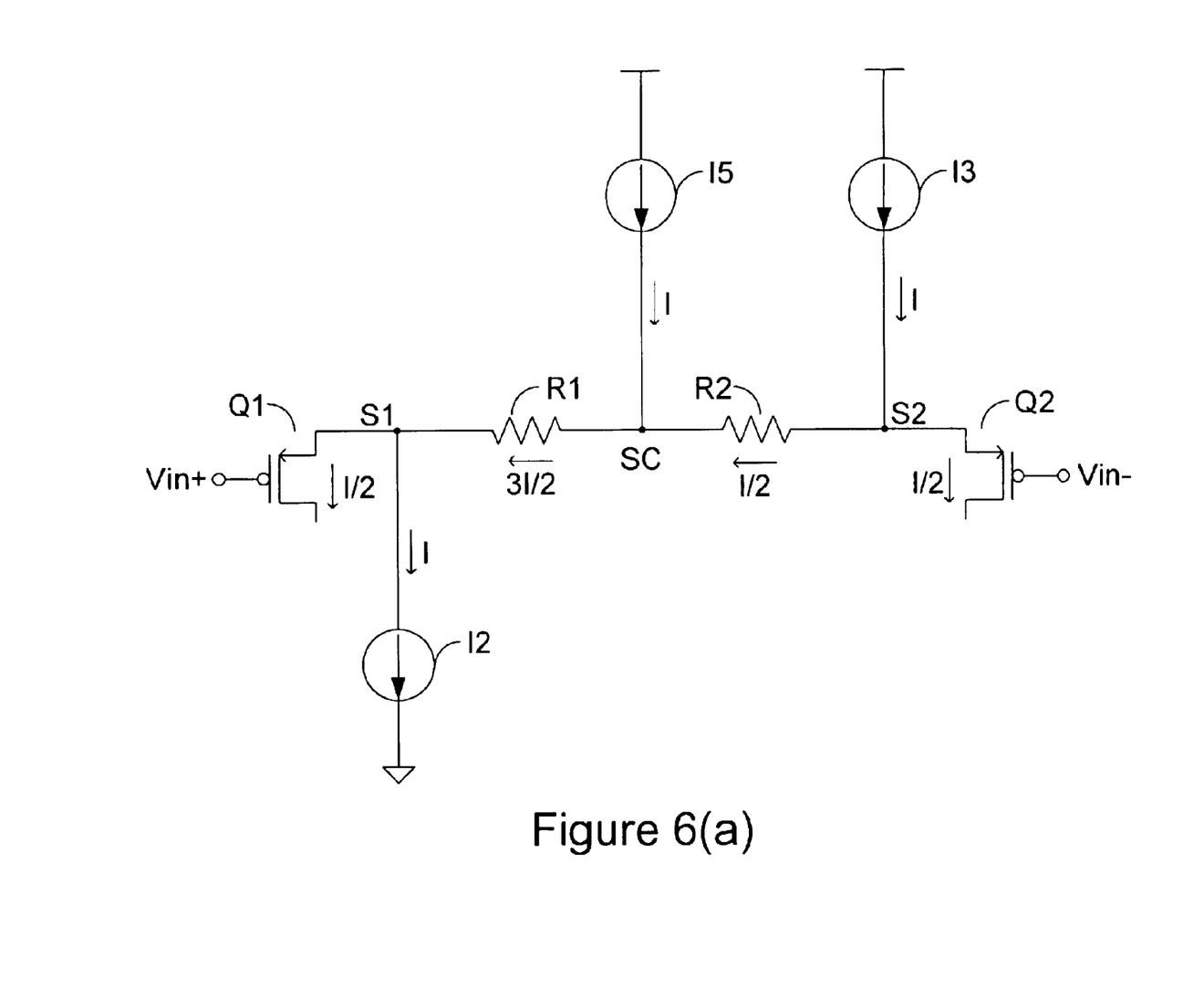
FIGS. 6(a) and 6(b) are circuit diagrams explaining the operations of the comparator as the output signal changes from logic high to logic low.
Figure 6B:
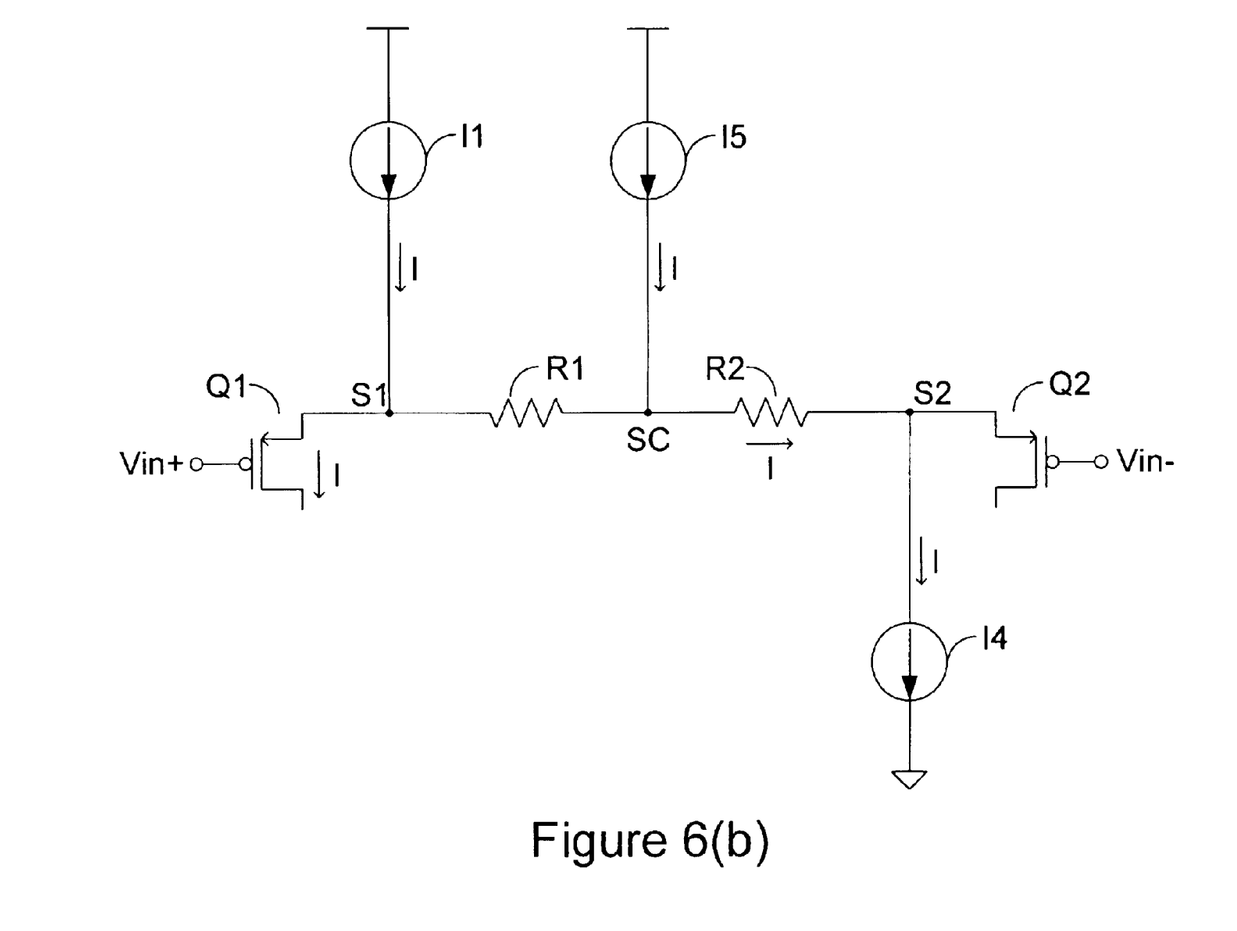

Similarly, FIGS. 6(a) and 6(b) are circuit diagrams explaining the operations of the comparator as the output signal changes from logic high to logic low. When the output signal Vout from the output terminal of the comparator is in a logic high state, the first and the fourth switches are OFF and the second and the third switches are ON, and therefore the third constant current source I3 supplies a constant current I to the source terminal S2 of the second PMOS transistor Q2 while the second constant current source I2 derives a constant current I out from the source terminal S1 of the first PMOS transistor Q1. At this time, if the first input signal Vin+ at the input terminal of the comparator gradually decreases so that the first input signal Vin+ falls below the second input signal Vin−, the first PMOS transistor Q1 will be turned ON but the second PMOS transistor Q2 has not yet been turned OFF. Therefore, as shown in FIG. 6 (a), each of the first PMOS transistor Q1 and the second PMOS transistor Q2 conducts a current of "I/2", and thus the current flowing through the second resistor R2 and the current flowing through the first resistor R1 are "I/2" and "3I/2", respectively. Accordingly, the voltage difference between the source terminal S1 of the first PMOS transistor Q1 and the source terminal S2 of the second PMOS transistor Q2 is −(I/2)×R−(3I/2)×R=−I×2R. For this reason, as the first input signal Vin+ falls below the second input signal Vin−, the output signal Vout will not immediately change from logic high to logic low. Instead, the output signal Vout changes from logic high to logic low only when the voltage difference ΔV between the first input signal Vin+ and the second input signal Vin− is smaller than −I×2R.

As shown in FIG. 6(b), after the output signal Vout changes from logic high to logic low, the first and the fourth switches are ON and the second and the third switches and OFF. In this case, the second and the third constant current sources I2 and I3 are considered no longer present, and therefore the first constant current source I1 supplies a constant current I to the source terminal S1 of the first PMOS transistor Q1 while the fourth constant current source I4 derives a constant current I out from the source terminal S2 of the second PMOS transistor Q2. At this time, the second PMOS transistor Q2 is turned OFF, and the first PMOS transistor Q1 conducts a current of "I".

Although in the above embodiment of the present invention the first to the fourth constant current sources I1~I4 are designed to produce the same constant current I as the fifth constant current source I5 and the first resistor R1 and the second resistor R2 are designed to have the same resistance value R, it should be considered as illustrative and not restrictive. In other embodiments, constant current sources producing different current values and resistors having different resistance values may be employed, as long as the current values and resistance values are properly selected to obtain the hysteresis effect as described in the above embodiment.

The hysteresis circuit according to the present invention is not only suitable for differential comparison but also for single-ended comparison. For differential comparison, two input terminals Vin+ and Vin− of the comparator are respectively connected to the two signals to be compared. For single-ended comparison, the inverting input terminal Vin− of the comparator is connected to a constant DC reference voltage, and the non-inverting input terminal Vin+ of the comparator is connected to the signal to be compared. In the comparing device described with reference to FIG. 2, the input at the inverting input terminal of the comparator 26 is limited by the threshold voltage generator 22, and therefore the device is not suitable for differential input comparison. In contrast to the prior art, the hysteresis circuit according to the present invention is applicable in a broad range of circuits.

While the present invention has been described with reference to the preferred embodiments thereof, it is to be understood that the invention should not be considered as limited thereby. Various modifications and changes could be conceived of by those skilled in the art without departuring from the scope of the present invention, which is indicated by the appended claims.

What is claimed is:

1. A hysteresis circuit for a comparator, said comparator comprising an input stage including a first transistor and a second transistor, each having a gate terminal serving as one of two input terminals of said comparator to receive one of two input signals, said comparator further comprising a constant current source connected to supply a constant current to said input stage of said comparator, said hysteresis circuit comprising:
   a first resistor element coupled between a source terminal of said first transistor and said constant current source of said comparator;
   a second resistor element coupled between a source terminal of said second transistor and said constant current source of said comparator;
   a first current generating means for supplying a first current to said source terminal of said first transistor and deriving a fourth current out from said source terminal of said second transistor when an output signal from an output terminal of said comparator is a first logic value; and
   a second current generating means for supplying a third current to said source terminal of said second transistor and deriving a second current out from said source terminal of said first transistor when said output signal from said output terminal of said comparator is a second logic value.

2. The hysteresis circuit for a comparator of claim 1, wherein said first to said fourth currents have the same current value.

3. The hysteresis circuit for a comparator of claim 1, wherein said first to said fourth currents are equal to the constant current produced by said constant current source of said comparator.

4. The hysteresis circuit for a comparator of claim 1, wherein said first resistor element and said second resistor element have the same resistance value.

5. The hysteresis circuit for a comparator of claim 1, wherein said first transistor and said second transistor are PMOS transistors.

6. The hysteresis circuit for a comparator of claim 1, wherein said first to said fourth currents have the same current value, wherein said first resistor element and said second resistor element have the same resistance value, and wherein a single-side hysteresis width generated by said hysteresis circuit for said comparator is equal to said current value multiplied by twice said resistance value while a double-side hysteresis width generated by said hysteresis circuit for said comparator is equal to twice the single-side hysteresis width.

7. A hysteresis circuit for a comparator, said comparator comprising an input stage including a first transistor and a second transistor, each having a gate terminal serving as one of two input terminals of said comparator to receive one of two input signals, said comparator further comprising a constant current source connected to supply a constant current to said input stage of said comparator, said hysteresis circuit comprising:
   a first resistor element coupled between a source terminal of said first transistor and said constant current source of said comparator;
   a second resistor element coupled between a source terminal of said second transistor and said constant current source of said comparator;
   a switching means including a first switch element, a second switch element, a third switch element and a fourth switch element, said switching means being controlled such that said first switch element and said fourth switch element are ON and said second switch element and said third switch element are OFF when an output signal from an output terminal of said comparator has a first logic value, and that said first switch element and said fourth switch element are OFF and said second switch element and said third switch element are ON when said output signal from said output terminal of said comparator has a second logic value;
   a first constant current source element for selectively supplying a first constant current to said source terminal of said first transistor through said first switch element;
   a second constant current source element for selectively deriving a second constant current out from said source terminal of said first transistor through said second switch element;
   a third constant current source element for selectively supplying a third constant current to said source terminal of said second transistor through said third switch element; and
   a fourth constant current source element for selectively deriving a fourth constant current out from said source terminal of said second transistor through said fourth switch element.

8. The hysteresis circuit for a comparator of claim 7, wherein the constant currents produced by said first to said fourth constant current source elements have the same current value.

9. The hysteresis circuit for a comparator of claim 7, wherein the first to fourth constant currents produced by said first to said fourth constant current source elements are equal to the constant current produce by said constant current source of said comparator.

10. The hysteresis circuit for a comparator of claim 7, wherein said first resistor element and said second resistor element have the same resistance value.

11. The hysteresis circuit for a comparator of claim 7, wherein said first transistor and the second transistor are PMOS transistors.

12. The hysteresis circuit for a comparator of claim 7, wherein the first to fourth constant currents produced by said first to said fourth constant current source elements have the same current value, wherein said first resistor element and said second resistor element have the same resistance value, and wherein a single-side hysteresis width generated by said hysteresis circuit for said comparator is equal to said current value multiplied by twice said resistance value while a double-side hysteresis width generated by said hysteresis circuit for said comparator is equal to twice the single-side hysteresis width.

13. A hysteresis circuit for a comparator, said comparator comprising an input stage including a first transistor and a second transistor, each having a gate terminal serving as one of two input terminals of said comparator to receive one of two input signals, said comparator further comprising a constant current source connected to supply a constant current to said input stage of said comparator, said hysteresis circuit comprising:
   a first and a second resistor elements having the same resistance value, said first resistor element being coupled between a source terminal of said first transistor and said constant current source of said comparator, and said second resistor element being coupled between a source terminal of said second transistor and said constant current source of said comparator;

a first to a fourth constant current source elements, each respectively producing a constant current having the same current value as the constant current produced by said constant current source of said comparator;

a first switch element coupled between said first constant current source element and said source terminal of said first transistor so that said first constant current source element selectively supplies the constant current to said source terminal of said first transistor;

a second switch element coupled between said second constant current source element and said source terminal of said first transistor so that said second constant current source element selectively derives the constant current out from said source terminal of said first transistor;

a third switch element coupled between said third constant current source element and said source terminal of said second transistor so that said third constant current source element selectively supplies the constant current to said source terminal of said second transistor;

a fourth switch element coupled between said fourth constant current source element and said source terminal of said second transistor so that said fourth constant current source element selectively derives the constant current from said source terminal of said second transistor; and a switch element control means for controlling ON/OFF operations of said first to said fourth switch elements so that said first switch element and said fourth switch element are ON and said second switch element and said third switch element are OFF when an output signal from an output terminal of said comparator has a first logic value and that said first switch element and said fourth switch element are OFF and said second switch element and said third switch element are ON when said output signal from said output terminal of said comparator has a second logic value.

14. The hysteresis circuit for a comparator of claim 13, wherein a single-side hysteresis width generated by said hysteresis circuit for said comparator is equal to said current value of said constant current multiplied by twice said resistance value of said resistor elements while a double-side hysteresis width generated by said hysteresis circuit for said comparator is equal to twice the single-side hysteresis width.

* * * * *